United States Patent
Chiu et al.

(10) Patent No.: US 11,984,412 B2
(45) Date of Patent: May 14, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chih-Hsien Chiu, Taichung (TW); Ko-Wei Chang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 18/097,965

(22) Filed: Jan. 17, 2023

(65) Prior Publication Data

US 2023/0154873 A1 May 18, 2023

Related U.S. Application Data

(62) Division of application No. 17/159,527, filed on Jan. 27, 2021, now Pat. No. 11,587,892.

(30) Foreign Application Priority Data

Sep. 21, 2020 (TW) .................. 109132583

(51) Int. Cl.
*H01L 23/64* (2006.01)
*H01L 21/48* (2006.01)
*H01L 21/56* (2006.01)
*H01L 23/00* (2006.01)
*H01L 23/31* (2006.01)
*H01L 23/498* (2006.01)
*H01L 49/02* (2006.01)

(52) U.S. Cl.
CPC ........ *H01L 23/645* (2013.01); *H01L 21/4853* (2013.01); *H01L 21/565* (2013.01); *H01L 23/3128* (2013.01); *H01L 23/49838* (2013.01); *H01L 24/16* (2013.01); *H01L 28/10* (2013.01); *H01L 2224/16227* (2013.01); *H01L 2924/19042* (2013.01); *H01L 2924/19103* (2013.01)

(58) Field of Classification Search
None
See application file for complete search history.

(56) References Cited

U.S. PATENT DOCUMENTS

2022/0093538 A1* 3/2022 Chiu ................. H01L 23/49838
2022/0238410 A1* 7/2022 Lambert ........... H01L 23/49816

* cited by examiner

*Primary Examiner* — Long Pham
(74) *Attorney, Agent, or Firm* — Kelly & Kelley, LLP

(57) ABSTRACT

An electronic package in which at least one magnetically permeable member is disposed between a carrier and an electronic component, where the electronic component has a first conductive layer, and the carrier has a second conductive layer, such that the magnetically permeable element is located between the first conductive layer and the second conductive layer. Moreover, a plurality of conductive bumps that electrically connect the first conductive layer and the second conductive layer are arranged between the electronic component and the carrier to surround the magnetically permeable member for generating magnetic flux.

10 Claims, 6 Drawing Sheets

ELECTRONIC PACKAGE AND MANUFACTURING METHOD THEREOF

This is a divisional of co-pending U.S. Ser. No. 17/159,527, filed Jan. 27, 2021, which claims priority to Taiwan Application Serial No. 109132583, filed Sep. 21, 2020.

BACKGROUND

1. Technical Field

The present disclosure relates to a semiconductor device, and more particularly, to an electronic package including a ferromagnetic material and a manufacturing method thereof.

2. Description of Related Art

In a typical semiconductor application device, such as a communication or high-frequency semiconductor device, multiple radio-frequency (RF) passive components, such as resistors, inductors, capacitors and oscillators, are often required to be electrically connected to the semiconductor chip to be packaged, so that the semiconductor chip has a specific current characteristic or emits signals.

For example, in a ball grid array (BGA) semiconductor device, most of the passive components are disposed on the surface of a substrate. However, in order to prevent these passive components from hindering the electrical connections between the semiconductor chip and bonding pads and arrangement thereof, these passive components are conventionally placed at the corners of the substrate or on an additional substrate layout area outside the placement area of the semiconductor chip.

However, limiting where the passive components can be placed will reduce the routability of the wires on the substrate. Meanwhile, this approach also needs to take into consideration that the number of passive components that can be placed will be restricted due to the locations of the bonding pads. This is unfavorable to the high integration of semiconductor devices. This problem is exacerbated when the number of passive components needed is increased in response to the demands for higher performance of semiconductor packages. If the conventional approach is used, then the surfaces of the substrate will need to simultaneously accommodate a plurality of semiconductor chips and a greater number of passive components. This means the area of the package substrate has to be increased, which inevitably entails a larger package that is counter to the trend for developing lighter, thinner and more compact semiconductor packages.

Based on the aforementioned issues, passive components have been manufactured as lumped components (e.g., chip-type inductors) that can be integrated to areas on the substrate between a semiconductor chip and bonding pads. For example, in a semiconductor package 1 shown in FIG. 1, a semiconductor chip 11 and one or more inductive components 12 are provided on a package substrate 10 having a circuit layer 100, and the semiconductor chip 11 is electrically connected to bonding pads 101 of the circuit layer 100 via a plurality of bonding wires 110.

Nevertheless, the inductive component 12 is a chip-type component and thus has a considerable large volume, especially of those inductive components 12 required by power supply circuits. In addition, an inductive component 12 may be too far from the semiconductor chip 11, and parasitic effect increases as the inductive component 12 gets further away from the semiconductor chip 11. The semiconductor package 1 may consequently have poor electrical performance.

Moreover, the inductive component 12 is formed on the surface of the package substrate 10, which occupies a significant amount of layout area of the package substrate 10. As a result, the semiconductor package 1 fails to meet the demand for miniaturization.

Furthermore, there is also an approach that involves replacing the chip-type inductive components 12 with coil-type inductors 12', as can be seen in a semiconductor package 1' shown in FIG. 1'. However, such coil-type inductor 12' is only provided on the package substrate 10, so the simulated inductance value generated by the coil-type inductor 12' is limited to such an extent that the inductance value of the coil-type inductor 12' is too small to meet the demand.

Therefore, there is a need for a solution that addresses the aforementioned issues in the prior art.

SUMMARY

In view of the aforementioned shortcomings of the prior art, the present disclosure provides an electronic package, which may include: a carrier; an electronic component provided on the carrier; at least one magnetically permeable member provided between the carrier and the electronic component; and a conductor structure including a first conductive layer disposed on the electronic component, a second conductive layer disposed on the carrier, and a plurality of conductive bumps provided between the electronic component and the carrier, wherein the magnetically permeable member is located between the first conductive layer and the second conductive layer, and the plurality of conductive bumps are electrically connected with the first conductive layer and the second conductive layer.

The present disclosure further provides a method of manufacturing an electronic package, which may include: providing an electronic component having a first conductive layer and a carrier having a second conductive layer; and disposing the electronic component on the carrier via a plurality of conductive bumps with at least one magnetically permeable member interposed between the electronic component and the carrier, wherein the plurality of conductive bumps are electrically connected with the first conductive layer and the second conductive layer, and the magnetically permeable member is located between the first conductive layer and the second conductive layer.

In the aforementioned electronic package and the manufacturing method thereof, the carrier may be a coreless circuit structure.

In the aforementioned electronic package and the manufacturing method thereof, the carrier may include a recess for accommodating the magnetically permeable member. For example, the conductor structure may further include a plurality of conductive pillars embedded in the carrier, and the plurality of conductive pillars are located around the recess and electrically connected with the conductive bumps and the second conductive layer.

In the aforementioned electronic package and the manufacturing method thereof, the magnetically permeable member may be bonded onto the carrier.

In the aforementioned electronic package and the manufacturing method thereof, the magnetically permeable member may be bonded onto the electronic component. For example, the magnetically permeable member may be embedded into the electronic component.

In the aforementioned electronic package and the manufacturing method thereof, a plurality of the magnetically permeable members may be disposed between the carrier and the electronic component.

In the aforementioned electronic package and the manufacturing method thereof, the carrier may be a package substrate with a core layer and circuit structures bonded to two opposite sides of the core layer.

In the aforementioned electronic package and the manufacturing method thereof, the electronic component may be an active component or a package structure.

As can be understood from the above, in the electronic package of the present disclosure and the manufacturing method thereof, arranging the first conductive layer and the second conductive layer of the conductor structure on the electronic component and the carrier, respectively, makes it easier for the conductor structure to surround the magnetically permeable member, thus increasing the magnetic flux generated by the magnetically permeable member and the conductor structure, which in turn increases the inductance, and thus the inductance value.

In addition, with the design of such magnetically permeable member, the inductance value of a single coil can be increased. Thus, compared to the coil-type inductor without a magnetically permeable member in the prior art, the present disclosure is able to achieve the same inductance value with fewer number of turns of the coil, thereby allowing the size of the inductor to be minimized.

BRIEF DESCRIPTION OF THE DRAWINGS

FIG. 1' is a schematic cross-sectional view of another conventional semiconductor package.

FIG. 2C' is a schematic partial top view of FIG. 2C.

DETAILED DESCRIPTION

Figure 1:
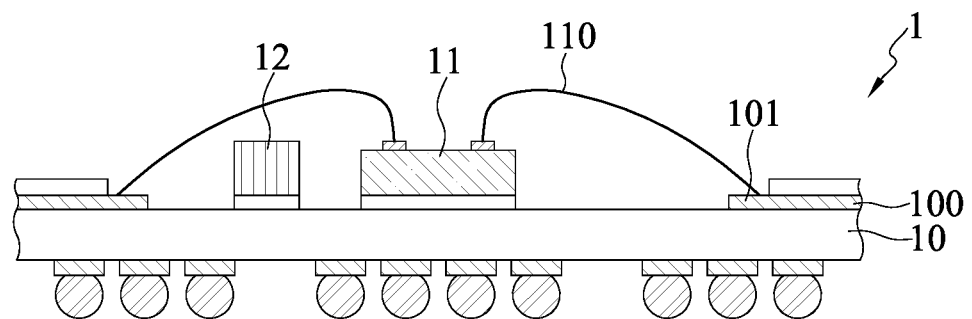
FIG. 1 is a schematic cross-sectional view of a conventional semiconductor package.
Figure 1:
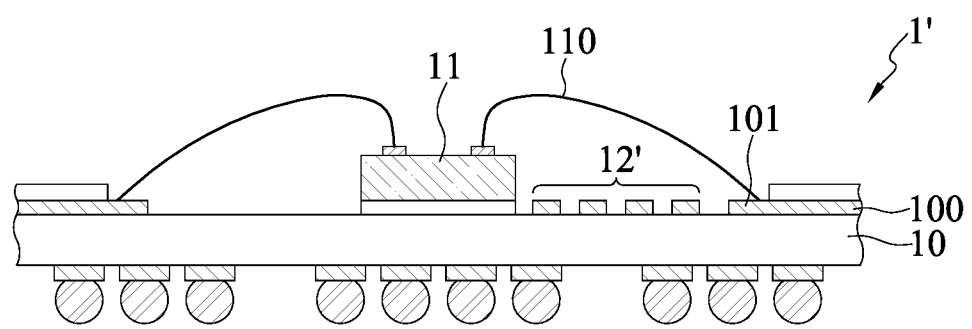

The implementations of present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIGS. 2A to 2D are schematic cross-sectional views illustrating a manufacturing method of an electronic package 2 in accordance with a first embodiment of the present disclosure.

Figure 2A:
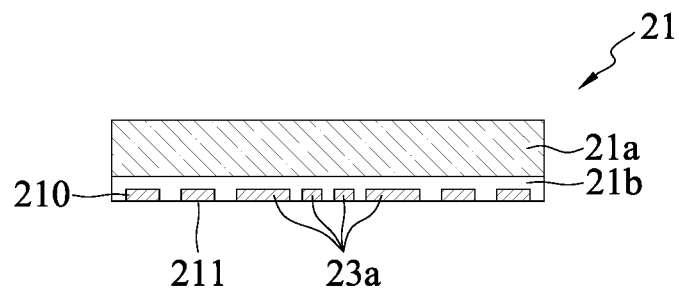
FIGS. 2A to 2D are schematic cross-sectional views illustrating a manufacturing method of an electronic package in accordance with a first embodiment of the present disclosure.

As shown in FIG. 2A, an electronic component 21 is provided, which can be an active component, such as a semiconductor chip. The electronic component 21 includes a semiconductor base 21a and a dielectric body 21b formed on the semiconductor base 21a. Integrated circuits are provided in the semiconductor base 21a, and at least one routing layer 210 and a first conductive layer 23a are provided in the dielectric body 21b.

In an embodiment, the routing layer 210 and the first conductive layer 23a are both made of copper, and the routing layer 210 is partially exposed from the dielectric body 21b to serve as contacts 211, and the first conductive layer 23a is electrically connected to the contacts 211.

Figure 2B:
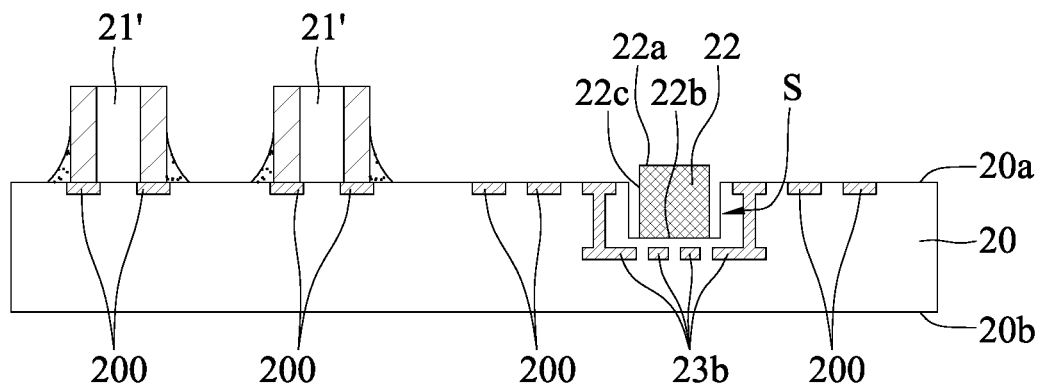

As shown in FIG. 2B, a carrier 20 having a recess S is provided, and a magnetically permeable member 22 is received in the recess S.

Figure 2C:
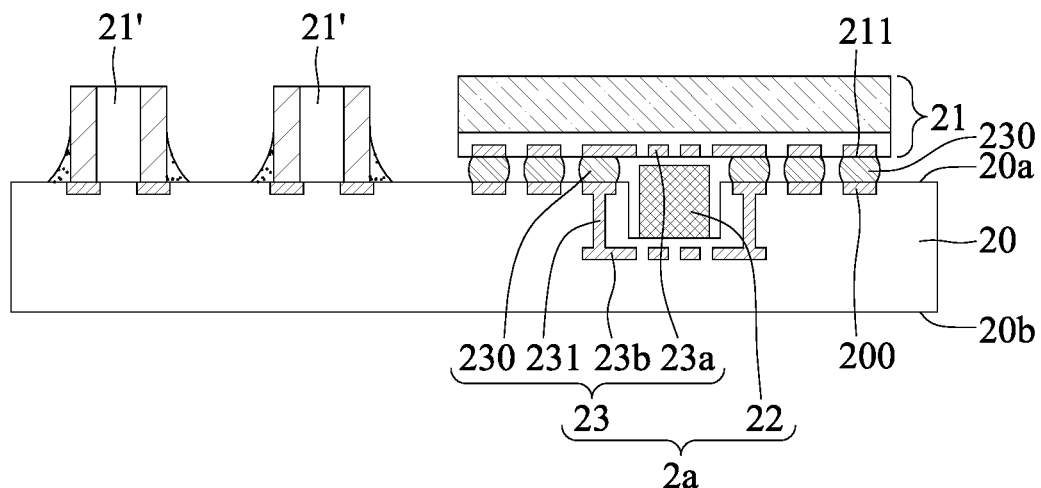
Figure 2C:
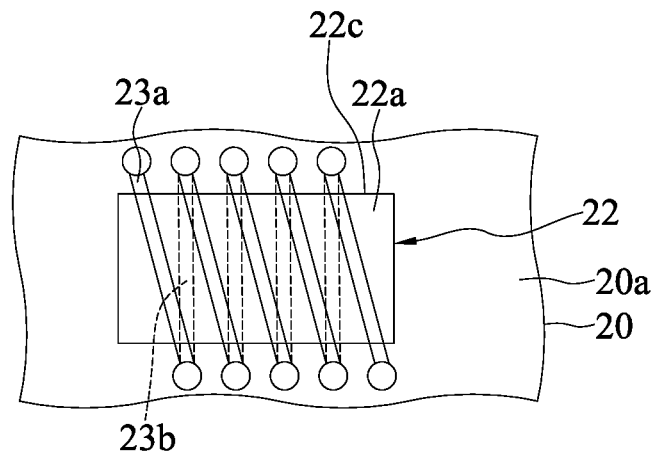

As shown in FIGS. 2B to 2C, the electronic component 21 is positioned on the carrier 20 at a location corresponding to the magnetically permeable member 22, such that the magnetically permeable member 22 is located between the carrier 20 and the electronic component 21.

In an embodiment, the carrier 20 is a coreless circuit structure, which includes at least a circuit layer 200 and a second conductive layer 23b, such as a fan-out redistribution layer (RDL), formed on a dielectric material. The dielectric material can be, for example, polybenzoxazole (PBO), polyimide (PI), a prepreg (PP), and the like. For example, the carrier 20 includes a first side 20a and a second side 20b opposite to each other. The electronic component 21 and the magnetically permeable member 22 are provided on the first side 20a of the carrier 20. It can be appreciated that other electronic components 21' can also be disposed on the first side 20a of the carrier 20.

Furthermore, the first side 20a of the carrier 20 is formed with the recess S, and the electronic component 21 correspondingly covers the top of the recess S. For example, the electronic component 21 is electrically connected to the circuit layer 200 of the carrier 20 via the contacts 211 and a plurality of conductive bumps 230 by flip-chip bonding. The second conductive layer 23b is disposed on the underside of the recess S. A plurality of conductive pillars 231 electrically connecting the second conductive layer 23b and the conductive bumps 230 are formed around correspondingly to the sidewalls of the recess S in the carrier 20.

Moreover, the magnetically permeable member 22 is a material with high permeability, such as a ferrite. The magnetically permeable member 22 includes a first surface 22a and a second surface 22b opposite to each other, and side faces 22c adjacent to the first surface 22a and the second surface 22b, so that the magnetically permeable member 22 is surrounded by a conductor structure 23. For example, the conductor structure 23 includes the first conductive layer 23a, the second conductive layer 23b, the conductive pillars 231 and the conductive bumps 230, such that the conductor structure 23 is coiled around the magnetically permeable member 22. More specifically, as shown in FIG. 2C', the first conductive layer 23a and the second conductive layer 23b are linear electrically conductive traces that are disposed at locations corresponding to the first surface 22a and the second surface 22b of the magnetically permeable member 22, respectively, whereas the conductive pillars 231 and the conductive bumps 230 are arranged at locations corresponding to the side faces 22c of the magnetically permeable member 22, so that the path of the coil sequentially goes through the first surface 22a, a side face 22c, the second surface 22b, and another side face 22c of the magnetically permeable member 22.

Moreover, the conductor structure 23 creates a magnetic flux with the magnetically permeable member 22, so the conductor structure 23 and the magnetically permeable member 22 together form an inductor 2a.

Figure 2D:
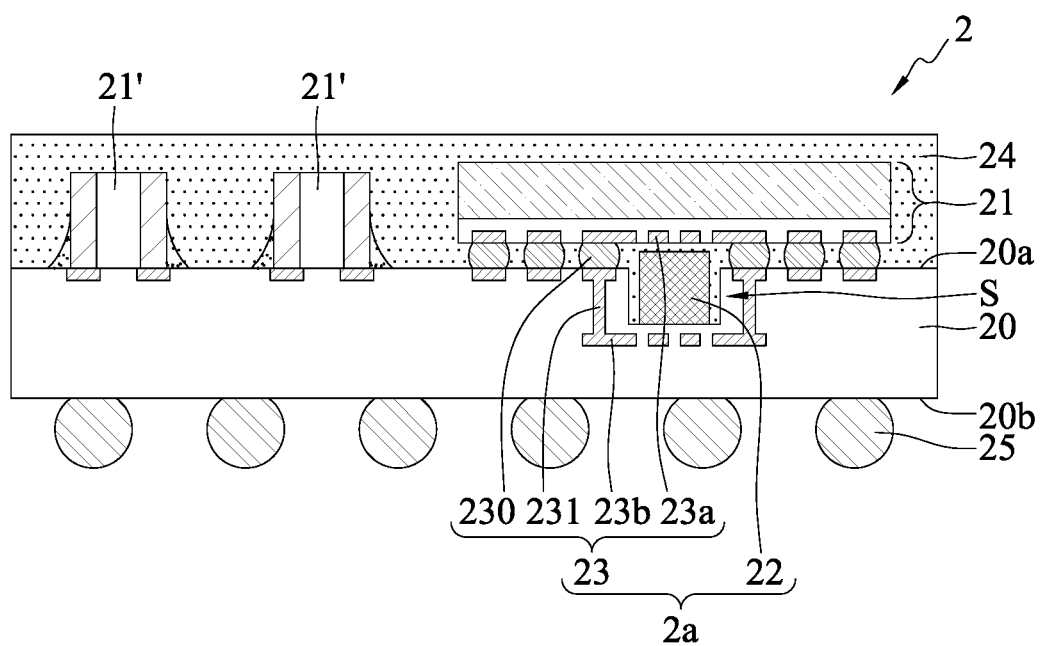

As shown in FIG. 2D, a packaging layer 24 is formed on the first side 20a of the carrier 20 to encapsulate the electronic components 21, 21', the magnetically permeable member 22 and the conductive bumps 230, so the magnetically permeable member 22 is fixated in the recess S.

In an embodiment, the packaging layer 24 is formed of an insulating material, such as polyimide (PI), a dry film, an epoxy resin or a molding compound. For example, the packaging layer 24 can be formed on the first side 20a of the carrier 20 by liquid compound application, injection, lamination, compression molding or the like.

Moreover, a plurality of conductive components 25 (e.g., solder balls) can be formed on the second side 20b of the carrier 20 depending on the needs.

In addition, a singulation process can be performed as needed if the carrier 20 is in the form of a wafer.

Therefore, in the manufacturing method of the present disclosure, the first conductive layer 23a and the second conductive layer 23b are disposed on the electronic component 21 and the carrier 20, respectively, and at least one magnetically permeable member 22 is disposed between the carrier 20 and the electronic component 21, such that the magnetically permeable member 22 is located between the first conductive layer 23a and the second conductive layer 23b, and the plurality of conductive bumps 230 electrically connecting the first conductive layer 23a and the second conductive layer 23b are disposed between the electronic component 21 and the carrier 20 so as to surround the magnetically permeable member 22, such that the magnetically permeable member 22 and the conductor structure 23 create magnetic flux.

Figure 3A:
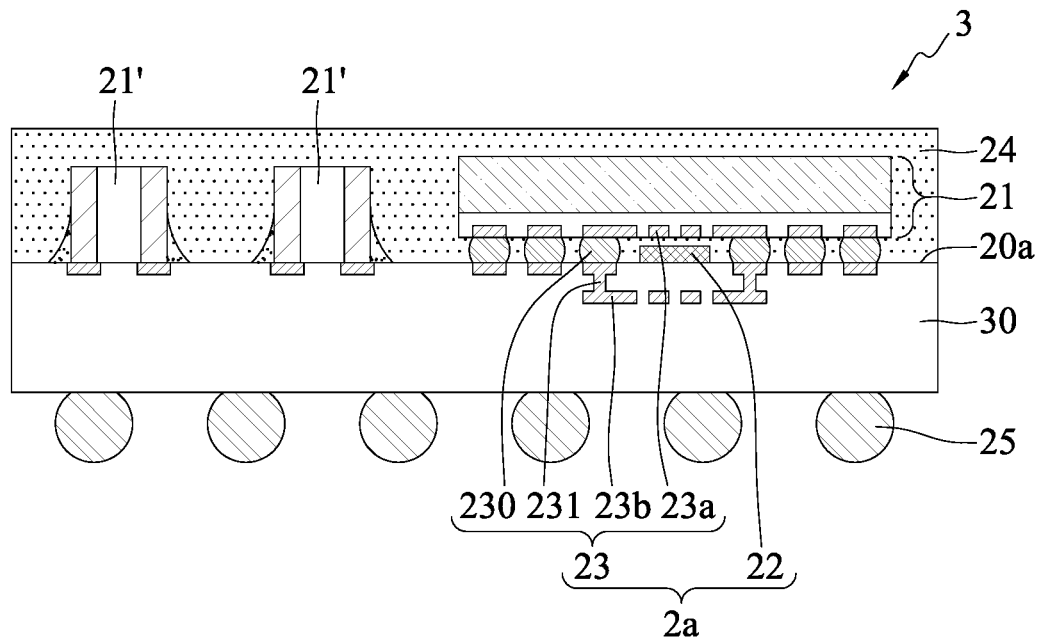
FIG. 3A is a schematic cross-sectional view of an electronic package in accordance with a second embodiment of the present disclosure.

FIG. 3A is a schematic cross-sectional view of an electronic package 3 in accordance with a second embodiment of the present disclosure. This embodiment is different from the first embodiment in the location of the magnetically permeable member 22 and the aspect of a carrier 30. As a result, only the differences are illustrated, and those that are the same or similar will not be repeated below.

As shown in FIG. 3A, the first side 20a of the carrier 30 is not formed with a recess. Rather, the magnetically permeable member 22 is formed on the surface of the first side 20a of the carrier 30.

Figure 3B:
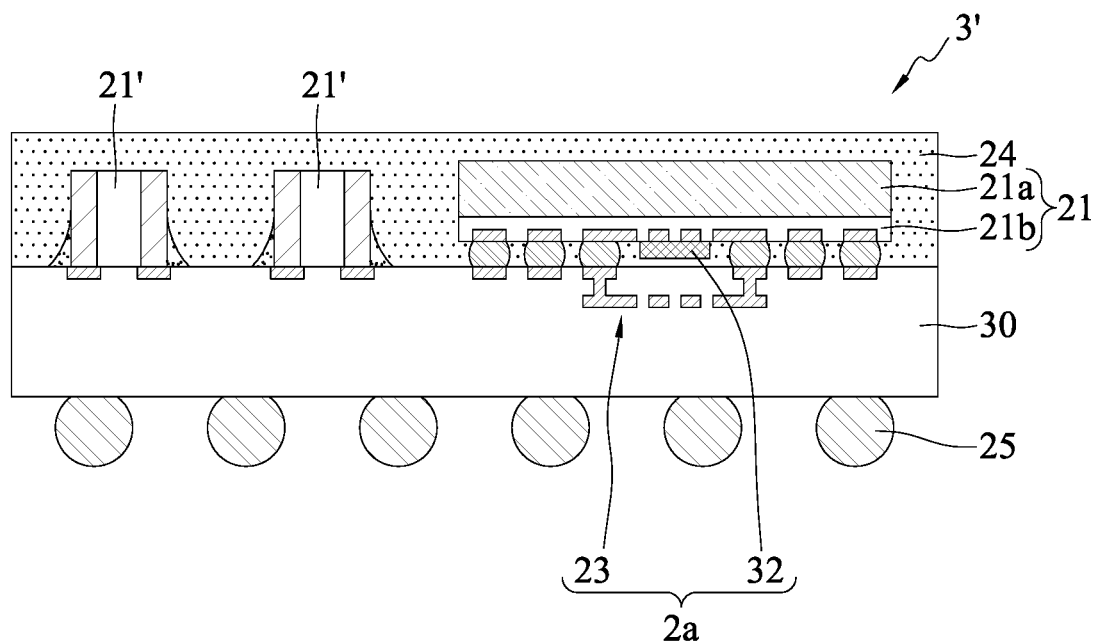
FIG. 3B is a schematic cross-sectional view of an electronic package in accordance with a third embodiment of the present disclosure.

FIG. 3B is a schematic cross-sectional view of an electronic package 3' in accordance with a third embodiment of the present disclosure. This embodiment differs from the second embodiment in the location of a magnetically permeable member 32. As a result, only the differences are illustrated, and those that are the same or similar will not be repeated below.

As shown in FIG. 3B, the magnetically permeable member 32 is provided on the surface of the dielectric body 21b of the electronic component 21.

Figure 4A:
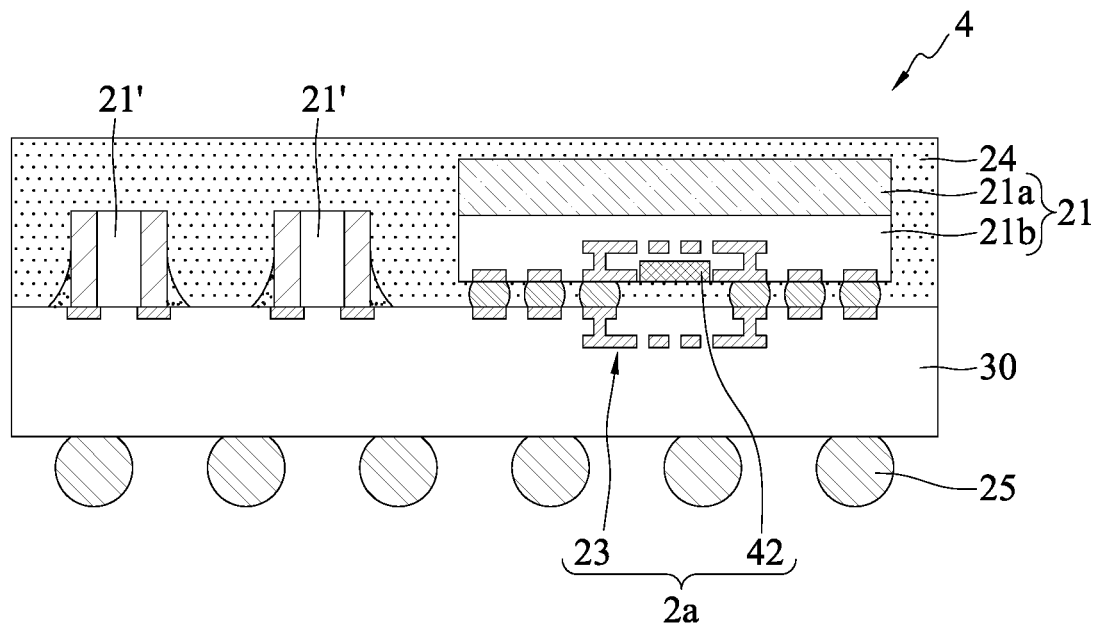
FIG. 4A is a schematic cross-sectional view of an electronic package in accordance with a fourth embodiment of the present disclosure.

FIG. 4A is a schematic cross-sectional view of an electronic package 4 in accordance with a fourth embodiment of the present disclosure. This embodiment differs from the third embodiment in the location of a magnetically permeable member 42. As a result, only the differences are illustrated, and those that are the same or similar will not be repeated below.

As shown in FIG. 4A, the magnetically permeable member 42 is embedded in the dielectric body 21b of the electronic component 21. In an embodiment, during the manufacturing of the electronic component 21, the magnetically permeable member 42 is embedded in the dielectric body 21b.

Figure 4B:
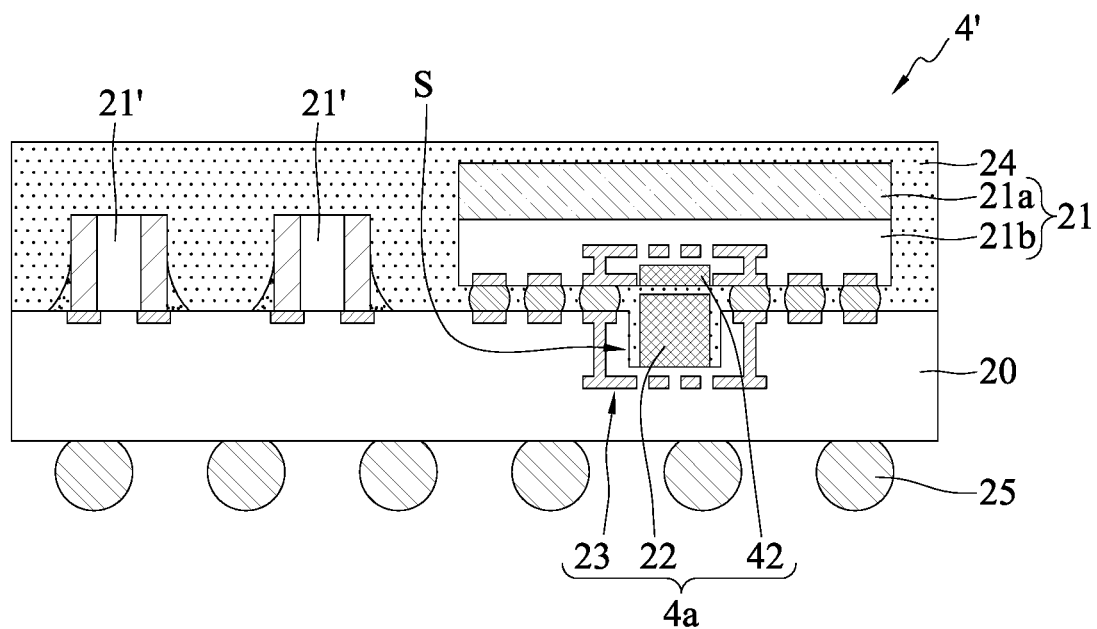
FIG. 4B is a schematic cross-sectional view of FIG. 4A in another aspect.

Furthermore, the electronic component 21 described with respect to the first embodiment can also be provided with the magnetically permeable member 42, such as an electronic package 4' shown in FIG. 4B. As a result, a plurality of magnetically permeable members 22, 42 are disposed between the carrier 20 and the electronic component 21 to increase the magnetic flux of an inductor 4a.

Figure 5:
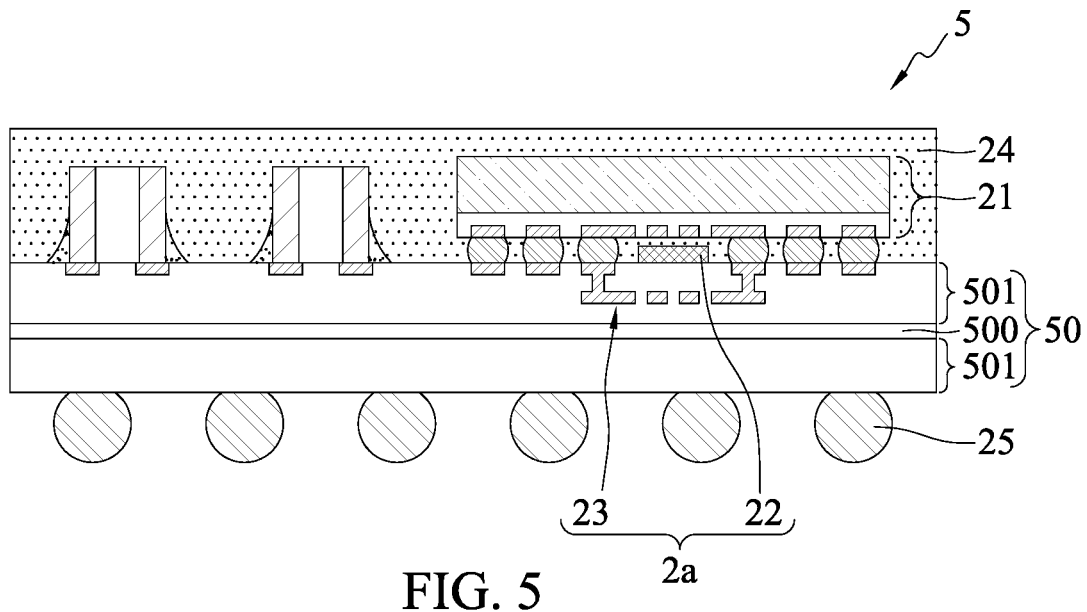
FIG. 5 is a schematic cross-sectional view of an electronic package in accordance with a fifth embodiment of the present disclosure.

FIG. 5 is a schematic cross-sectional view of an electronic package 5 in accordance with a fifth embodiment of the present disclosure. This embodiment differs from the above embodiments in the aspect of a carrier 50. As a result, only the differences are illustrated, and those that are the same or similar will not be repeated below.

As shown in FIG. 5, based on the second embodiment, the carrier 50 is a package substrate including a core layer 500 and circuit structures 501 bonded to the two opposite sides of the core layer 500. The circuit structure 501 includes at least one circuit layer and the second conductive layer 23b formed on a dielectric material, such as a fan-out RDL, and the dielectric material can be, for example, PBO, PI, a prepreg, or the like.

Figure 6:
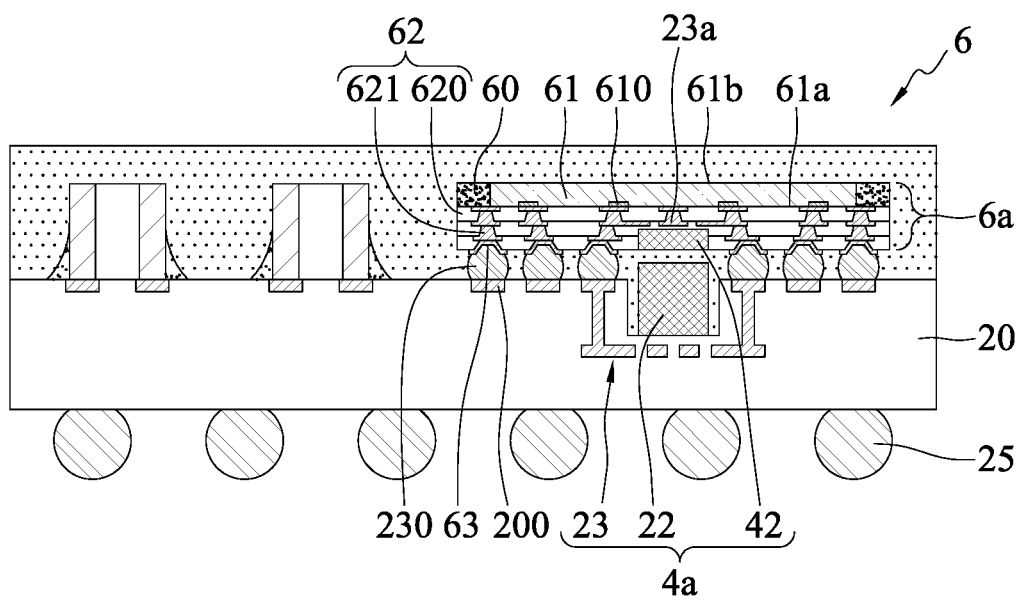
FIG. 6 is a schematic cross-sectional view of an electronic package in accordance with a sixth embodiment of the present disclosure.

FIG. 6 is a schematic cross-sectional view of an electronic package 6 in accordance with a sixth embodiment of the present disclosure. This embodiment differs from the above embodiments in the aspect of an electronic component 6a. As a result, only the differences are illustrated, and those that are the same or similar will not be repeated below.

As shown in FIG. 6, based on the first embodiment, the electronic component 6a is a package structure, such as a wafer level package (WLP) structure or a chip scale package (CSP) structure, wherein at least a semiconductor chip 61 is covered by an encapsulating layer 60, and a circuit portion 62 electrically connected with the semiconductor chip 61 is formed on the encapsulating layer 60.

In an embodiment, the encapsulating layer 60 is formed of an insulating material, such as polyimide (PI), a dry film, an epoxy resin or a molding compound. For example, the encapsulating layer 60 can be formed by liquid compound application, injection, lamination, compression molding or the like. It can be appreciated that the encapsulating layer 60 and the packaging layer 24 can be made of the same or different material(s).

Moreover, the semiconductor chip 61 includes an active face 61a and a non-active face 61b opposite to each other. A plurality of electrode pads 610 are provided on the active face 61a.

In addition, the circuit portion 62 includes at least a dielectric layer 620 and at least one RDL 621 provided on the dielectric layer 620 and electrically connected with the electrode pads 610. The first conductive layer 23a is provided in the dielectric layer 620 and electrically connected to the RDL 621. For example, the RDL 621 can be made of copper, and the dielectric layer 620 can be made of PBO, PI, a prepreg, or other types of dielectric materials. More specifically, the RDL 621 of the electronic component 6a is partially exposed from the dielectric layer 620 to be used as contacts 63, such that the contacts 63 are electrically connected with the circuit layer 200 of the carrier 20 via the conductive bumps 230.

Furthermore, during the manufacturing of the circuit portion 62, the magnetically permeable member 42 is also embedded in the dielectric layer 620.

In the electronic package 2, 3, 3', 4, 4', 5, 6 in accordance with the present disclosure, with the conductor structure 23 surrounding the magnetically permeable member 22, 32, 42, magnetic fields can be concentrated towards the ferromagnetic path (i.e., the magnetically permeable member 22, 32, 42) with low magnetic resistance, thereby increasing the magnetic flux, which in turn increases the inductance. This allows the inductance value of the present disclosure to be significantly raised.

Moreover, with the design of the magnetically permeable member 22, 32, 42, the present disclosure is capable of increasing the inductance of a single coil. Thus, compared to a coil-type inductor without a ferromagnetic material of the prior art, the present disclosure achieves the same inductance value with less number of turns. For example, a conventional coil-type inductor needs three turns of wire to achieve 17 nH, while the coil of the present disclosure only needs one turn to achieve 17 nH.

Also, the inductor 2a, 4a of the present disclosure consists of the conductor structure 23 and the magnetically permeable member 22, 32, 42, thus the size of the inductor can be minimized depending on the needs. For example, in order to achieve the same inductance value, the number of turns of the coil in accordance with the present disclosure is less than that of the coil-type inductor of the prior art. As a result, the size of the inductor can be reduced. Moreover, since no wires need to be laid out within the magnetically permeable member 22, 32, 42 (i.e., a pure magnetically permeable material), so its volume can be reduced if needed. Therefore, the inductor in accordance with the present disclosure satisfies the demand for miniaturization.

Therefore, compared to the prior art, the electronic package 2, 3, 3', 4, 4', 5, 6 in accordance with the present disclosure is capable of producing an inductor 2a, 4a occupying a smaller layout area while generating a larger inductance value.

The present disclosure further provides an electronic package 2, 3, 3', 4, 4', 5, 6 that includes: a carrier 20, 30, 50, an electronic component 21, 6a, at least one magnetically permeable member 22, 32, 42, and a conductor structure 23.

The carrier 20, 30, 50 includes a first side 20a and a second side 20b opposite to each other.

The electronic component 21, 6a is provided on the carrier 20, 30, 50.

The magnetically permeable member 22, 32, 42 is provided between the carrier 20, 30, 50 and the electronic component 21, 6a.

The conductor structure 23 includes a first conductive layer 23a disposed on the electronic component 21, 6a, a second conductive layer 23b disposed on the carrier 20, 30, 50, and a plurality of conductive bumps 230 provided between the electronic component 21, 6a and the carrier 20, 30, 50, such that the magnetically permeable member 22, 32, 42 is located between the first conductive layer 23a and the second conductive layer 23b, and the plurality of conductive bumps 230 are electrically connected with the first conductive layer 23a and the second conductive layer 23b.

In an embodiment, the carrier 20, 30 is a coreless circuit structure.

In an embodiment, the carrier 20 includes a recess S for accommodating the magnetically permeable member 22. For example, the conductor structure 23 further includes a plurality of conductive pillars 231 embedded in the carrier 20, and the plurality of conductive pillars 231 are located around the sidewalls of the recess S and electrically connected with the conductive bumps 230 and the second conductive layer 23b.

In an embodiment, the magnetically permeable member 22 is bonded onto the surface of the first side 20a of the carrier 30.

In an embodiment, the magnetically permeable member 32, 42 is bonded onto the electronic component 21. Furthermore, the magnetically permeable member 42 is embedded into the electronic component 21.

In an embodiment, a plurality of the magnetically permeable members 22, 42 are disposed between the carrier 20 and the electronic component 21.

In an embodiment, the carrier 50 is a package substrate with a core layer 500 and circuit structures 501 bonded to two opposite sides of the core layer 500.

In an embodiment, the electronic component 21 is an active component.

In an embodiment, the electronic component 6a is a package structure.

In conclusion, in the electronic package of the present disclosure and the manufacturing method thereof, arranging the first conductive layer and the second conductive layer of the conductor structure on the electronic component and the carrier, respectively, makes it easier for the conductor structure to surround the magnetically permeable member, thus increasing the magnetic flux generated by the magnetically permeable member and the conductor structure, which in turn increases the inductance, and thus the inductance value. In addition, with the design of such magnetically permeable member, the inductance value of a single coil can be increased. Thus, compared to the coil-type inductor without a magnetically permeable member in the prior art, the present disclosure is able to achieve the same inductance value with fewer number of turns of the coil, thereby minimizing the size of the inductor.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A method of manufacturing an electronic package, comprising:
providing an electronic component having a first conductive layer and a carrier having a second conductive layer; and
disposing the electronic component on the carrier via a plurality of conductive bumps with at least one magnetically permeable member interposed between the electronic component and the carrier, wherein the plurality of conductive bumps are electrically connected with the first conductive layer and the second conductive layer, and the magnetically permeable member is located between the first conductive layer and the second conductive layer.

2. The method of claim 1, wherein the carrier is a coreless circuit structure.

3. The method of claim 1, wherein the carrier includes a recess for accommodating the magnetically permeable member.

4. The method of claim 3, further comprising forming a plurality of conductive pillars in the carrier, wherein the plurality of conductive pillars are located around the recess and electrically connected with the conductive bumps and the second conductive layer.

5. The method of claim 1, wherein the magnetically permeable member is bonded onto the carrier.

6. The method of claim 1, wherein the magnetically permeable member is bonded onto the electronic component.

7. The method of claim 1, wherein the magnetically permeable member is embedded into the electronic component.

8. The method of claim 1, further comprising disposing a plurality of the magnetically permeable members between the carrier and the electronic component.

9. The method of claim 1, wherein the carrier is a package substrate with a core layer and circuit structures bonded to two opposite sides of the core layer.

10. The method of claim 1, wherein the electronic component is an active component or a package structure.

* * * * *